(12) United States Patent
Senoo et al.

(10) Patent No.: US 7,361,971 B2
(45) Date of Patent: Apr. 22, 2008

(54) SEMICONDUCTOR WAFER PROTECTION STRUCTURE AND LAMINATED PROTECTIVE SHEET FOR USE THEREIN

(75) Inventors: Hideo Senoo, Kawaguchi (JP); Koichi Nagamoto, Saitama (JP); Katsuhiko Horigome, Saitama (JP); Hitoshi Ohashi, Saitama (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 10/525,996

(22) PCT Filed: Aug. 21, 2003

(86) PCT No.: PCT/JP03/10570

§ 371 (c)(1),
(2), (4) Date: Feb. 28, 2005

(87) PCT Pub. No.: WO2004/021432

PCT Pub. Date: Mar. 11, 2004

(65) Prior Publication Data

US 2006/0043532 A1 Mar. 2, 2006

(30) Foreign Application Priority Data

Aug. 28, 2002 (JP) ............................. 2002-249622
Dec. 4, 2002 (JP) ............................. 2002-352626

(51) Int. Cl.
*H01L 23/544* (2006.01)
*H01L 23/06* (2006.01)

(52) U.S. Cl. ...................................... 257/620; 257/684

(58) Field of Classification Search ........ 257/618–620, 257/684

See application file for complete search history.

(56) References Cited

U.S. PATENT DOCUMENTS

| 5,882,956 | A | 3/1999 | Umehara et al. |
| 6,297,131 | B1 | 10/2001 | Yamada et al. |
| 6,436,795 | B2 | 8/2002 | Noguchi et al. |
| 6,465,329 | B1 * | 10/2002 | Glenn ........................ 438/114 |
| 2002/0001688 | A1 * | 1/2002 | Ueda et al. ................. 428/35.7 |
| 2003/0003688 | A1 * | 1/2003 | Tandy et al. ................ 438/459 |

FOREIGN PATENT DOCUMENTS

| EP | 0 786 802 A2 | 7/1997 |
| EP | 999250 A2 | 5/2000 |
| EP | 1 107 299 A2 | 6/2001 |
| EP | 1 122 776 A2 | 8/2001 |
| JP | 6-310480 A | 11/1994 |
| JP | 7-45559 A | 2/1995 |
| JP | 9-115863 A | 5/1997 |
| JP | 2000-129227 A | 5/2000 |
| JP | 2001-244317 A | 9/2001 |

* cited by examiner

*Primary Examiner*—Cuong Nguyen
(74) *Attorney, Agent, or Firm*—The Webb Law Firm, P.C.

(57) ABSTRACT

A semiconductor wafer protection structure including a semiconductor wafer and a protective sheet overlaid on a circuit surface of the semiconductor wafer, wherein the protective sheet has a larger diameter than the outer diameter of the semiconductor wafer. Semiconductor wafer protection structures and methods, and laminated protective sheet for use therein are provided and enable prevention of damage to a wafer during grinding and transportation when the wafer is ground to an ultrathin thickness and transported. Also provided is a process for processing a semiconductor wafer whereby damage to the wafer can be reduced during application and cutting of an adhesive sheet.

5 Claims, 2 Drawing Sheets

SEMICONDUCTOR WAFER PROTECTION STRUCTURE AND LAMINATED PROTECTIVE SHEET FOR USE THEREIN

FIELD OF THE INVENTION

The present invention relates to a semiconductor wafer protection structure and method, a laminated protective sheet for use therein, and a process for processing a semiconductor wafer. More particularly, the invention relates to a semiconductor wafer protection structure and method suitably used for grinding a semiconductor wafer to an ultrathin thickness and for storage and transportation of the semiconductor wafer, and also relates to a laminated protective sheet for use in the structure and method. The invention further relates to a process for processing a semiconductor wafer with using the semiconductor wafer protection method.

BACKGROUND OF THE INVENTION

In recent years, the spread of IC cards has been promoted, and further reduction of thickness thereof is now demanded. Accordingly, it is now required that the thickness of semiconductor chips, which has been about 350 µm, be reduced to 50-100 µm or less. Further, increase of wafer diameter has been studied for improving productivity.

Wafer backgrinding is a conventional step performed after formation of circuit pattern. In the wafer backgrinding, a protective sheet is applied to the circuit surface to protect the circuit surface and to fix the wafer. The protective sheet used in the backgrinding is previously cut into substantially the same shape as the wafer to prevent vibration of the protective sheet during the backgrinding.

The present applicant has made various proposals on the protective sheets; for example, Japanese Patent Applications Nos. 2001-329146 and 2002-67080 propose laminated protective sheets including a rigid film and a stress relaxation film. The use of such laminated protective sheets enables reduction of damage to the wafers because the stress relaxation film reduces the stress occurring during the wafer backgrinding and the rigid film adds strength for wafer transportation.

However, the wafer ground to an ultrathin thickness suffers remarkably lowered strength and is damaged even by a weak impact. For example, a problem occurs as follows. After the backgrinding, the wafers are stored in a wafer cassette and transported to the subsequent steps. The wafers stored in the wafer cassette are usually transported by hand. The transportation often results in chipped wafer edges and cracked wafers by contact of wafer edges to the sidewalls of the wafer cassette.

JP-A-2000-353682 and JP-A-2002-57208 (now JP-A-2003-129011 and JP-A-2003-261842 respectively) disclose techniques wherein a protective sheet is applied to a semiconductor wafer and is cut into a slightly smaller size than the maximum wafer diameter, and the wafer is subjected to subsequent steps such as backgrinding. These techniques can suppress "play" of the protective sheet, so that the vibration of the protective sheet during backgrinding can be reduced. However, they cannot prevent contact of the wafer edges to the sidewalls of the wafer cassette during transportation. Meanwhile, the wafer backgrinding is often followed by application of an adhesive sheet to the ground wafer surface for various purposes such as formation of a die-bonding adhesive layer. After the adhesive sheet is applied, the protective sheet is peeled to transfer the wafer to the adhesive sheet. Herein, the adhesive sheet applied to the wafer is cut in substantially the same diameter as the wafer. The cutting of the adhesive sheet is performed by running a cutter along the outer periphery of the wafer. Accordingly, the adhesive sheet can be cut in substantially the same diameter as the wafer. However, the cutting blade is brought into contact with the outer periphery of the wafer and often damages the wafer.

SUMMARY OF THE INVENTION

The present invention has been made in view of the aforementioned background art. It is therefore an object of the invention to provide a semiconductor wafer protection structure and method, and a laminated protective sheet for use therein that enable prevention of damage to a wafer during grinding and transportation when the wafer is ground to an ultrathin thickness and transported. It is another object of the invention to provide a process for processing a semiconductor wafer whereby damage to the wafer can be reduced during application and cutting of an adhesive sheet.

A first semiconductor wafer protection structure according to the present invention comprises a semiconductor wafer and a protective sheet overlaid on a circuit surface of the semiconductor wafer, wherein the protective sheet has a larger diameter than the outer diameter of the semiconductor wafer.

A second semiconductor wafer protection structure according to the present invention comprises a semiconductor wafer and a laminated protective sheet overlaid on a circuit surface of the semiconductor wafer, wherein the laminated protective sheet comprises a first protective layer having substantially the same size as the outer diameter of the semiconductor wafer and a second protective layer laminated on the first protective layer and having an outer diameter that is equal to or larger than the outer diameter of the first protective layer, and the laminated protective sheet is overlaid on the circuit surface via the side of the first protective layer.

In the above protection structures, the protective sheet or the laminated protective sheet preferably has a maximum diameter that is larger than the outer diameter of the semiconductor wafer by +0.1 to 10 mm.

In the laminated protective sheet, the first protective layer preferably has an outer diameter that is smaller than the outer diameter of the semiconductor wafer by −2.0 to 0 mm and the second protective layer preferably has an outer diameter that is larger than the outer diameter of the semiconductor wafer by +0.1 to +2.0 mm.

In the laminated protective sheet, the first protective layer preferably includes a film having a stress relaxation rate of at least 40% after 1 minute of 10% elongation, and the second protective layer preferably includes a film having a value of Young's modulus×thickness of at least $5.0 \times 10^4$ N/m.

A first semiconductor wafer protection method according to the present invention comprises overlaying a circuit surface of a semiconductor wafer with a protective sheet having a larger diameter than the outer diameter of the semiconductor wafer.

A second semiconductor wafer protection method according to the present invention comprises overlaying a circuit surface of a semiconductor wafer with a laminated protective sheet, wherein the laminated protective sheet comprises a first protective layer having substantially the same size as the outer diameter of the semiconductor wafer and a second protective layer laminated on the first protective layer and having an outer diameter that is equal to or larger than the outer diameter of the first protective layer, and the laminated protective sheet is overlaid on the circuit surface via the side of the first protective layer.

In the first and second protection methods, the protective sheet or the laminated protective sheet preferably has a maximum diameter that is larger than the outer diameter of the semiconductor wafer by +0.1 to 10 mm.

Preferred embodiments of the laminated protective sheet are as described above.

A laminated protective sheet for semiconductor wafer according to the present invention is a laminate comprising a first protective layer and a second protective layer, wherein the second protective layer has a larger outer diameter than that of the first protective layer.

Preferred embodiments of the laminated protective sheet for semiconductor wafer are as described above with respect to the laminated protective sheet.

The present invention provides the semiconductor wafer protection structures and methods, and the laminated protective sheet for use therein that enable prevention of damage to a wafer during grinding and transportation when the wafer is ground to an ultrathin thickness and transported.

A process for processing a semiconductor wafer according to the present invention comprises a step comprising backgrinding a semiconductor wafer and applying an adhesive sheet to the ground surface while protecting the semiconductor wafer by the aforesaid semiconductor wafer protection method.

The process for processing a semiconductor wafer generally comprises a further step to be performed after application of the adhesive sheet, the step comprising:

cutting off an outer peripheral portion of the adhesive sheet with a cutter in a manner such that the cutter is moved along an outer peripheral end surface of the protective sheet or the laminated protective sheet.

According to the process for processing a semiconductor wafer as described above, a semiconductor wafer is not damaged when an adhesive sheet is applied thereto, and the wafer's end surface is prevented from contact with a cutting blade when an outer peripheral portion of the adhesive sheet is cut off. Therefore, the probability that the wafer will be damaged during application and cutting of the adhesive sheet can be reduced.

DETAILED DESCRIPTION OF THE INVENTION

Hereinbelow, the present invention will be described in greater detail with reference to the drawings.

Figure 1:
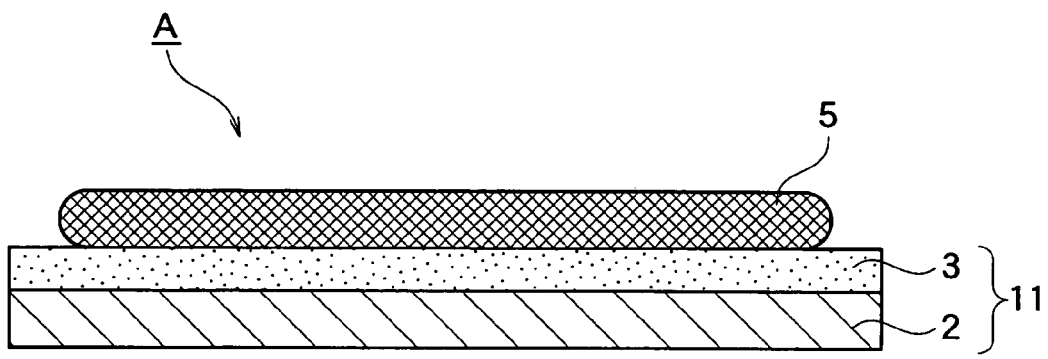
FIG. 1 is a schematic sectional view of the first protection structure according to the present invention.

As illustrated in FIG. 1, a first protection structure "A" for semiconductor wafer includes a semiconductor wafer 5 and a protective sheet 11 overlaid on a circuit surface of the semiconductor wafer, wherein the protective sheet has a larger diameter than the outer diameter of the semiconductor wafer.

The protective sheet 11 is generally composed of a substrate 2 and a pressure-sensitive adhesive (hereinafter "PSA") layer 3 formed thereon. The substrate 2 may be a multilayered substrate.

Figure 2:
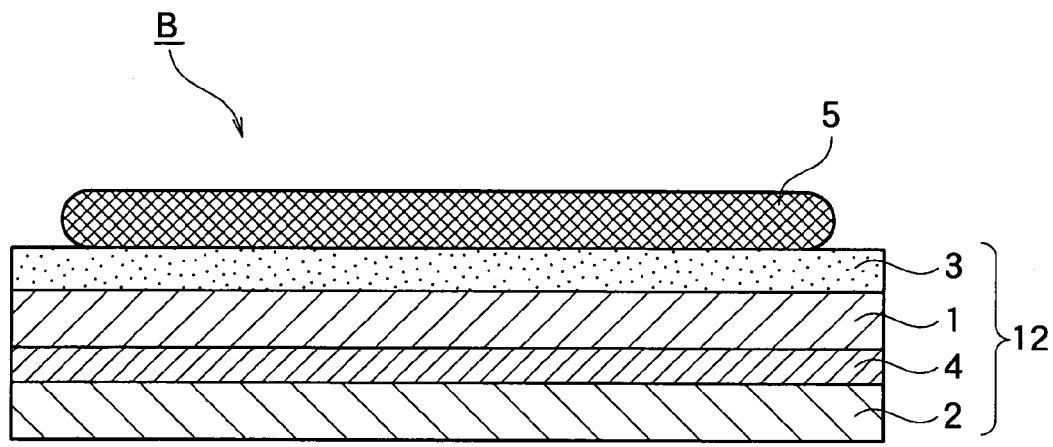
FIG. 2 is a schematic sectional view of the second protection structure according to one embodiment of the present invention.
Figure 3:
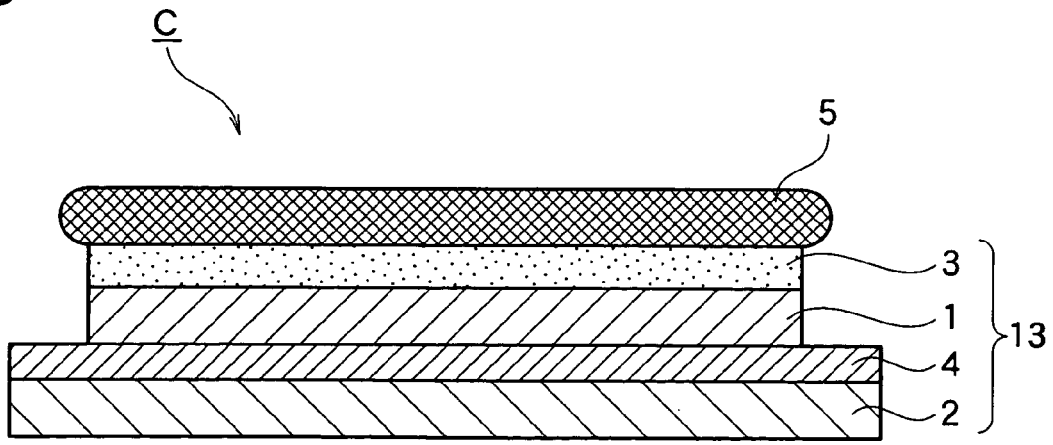
FIG. 3 is a schematic sectional view of the second protection structure according to another embodiment of the present invention.

That is, as shown in FIG. 2 or 3, second protection structures "B" and "C" for semiconductor wafer include a semiconductor wafer and a laminated protective sheet 12 or 13 overlaid on a circuit surface of the semiconductor wafer, wherein the laminated protective sheet includes a first protective layer 1 having substantially the same size as the outer diameter of the semiconductor wafer and a second protective layer 2 laminated on the first protective layer 1 and having an outer diameter that is equal to (FIG. 2) or larger than (FIG. 3) the outer diameter of the first protective layer 1. The laminated protective sheet 12 or 13 is overlaid on the circuit surface via the side of the first protective layer 1.

The semiconductor wafer protection structures having the above constitutions enable the wafers to be stored in a wafer cassette such that the end of the wafers 5 is prevented from direct contact with the cassette sidewalls. Thus, damage to the wafers can be prevented. That is, the end portion of the protective sheet functions as cushion to protect the wafer 5. Meanwhile, rigid protective sheet layers are generally difficult to peel by a stripping tape. In the present invention, the end portion of the protective sheet protrudent outward farther than the wafer 5 can work as a lead for peeling. Accordingly, the protective sheet can be easily peeled even if it includes a rigid film.

Figure 4:
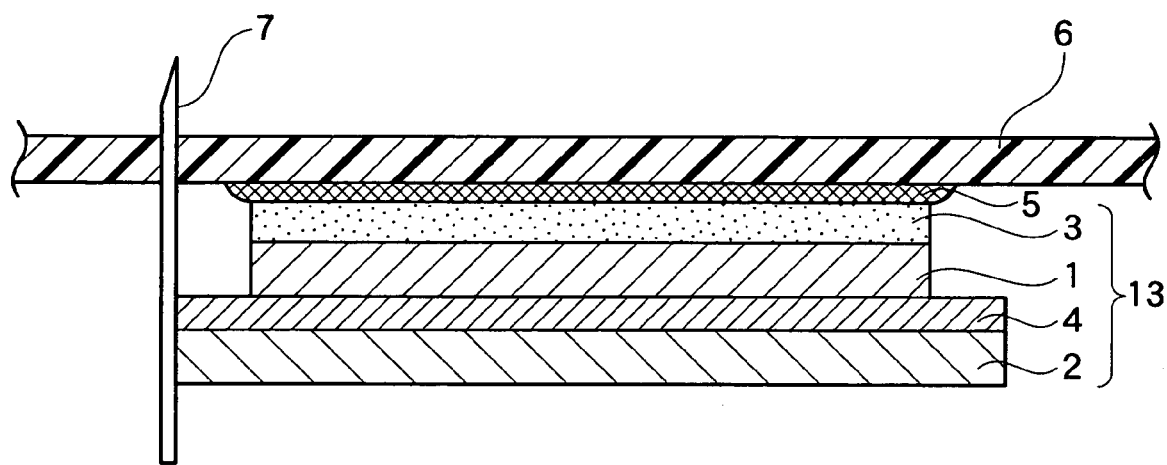
FIG. 4 illustrates a step of the process for processing a semiconductor wafer according to the present invention.

Moreover, when an adhesive sheet 6 is applied to the ground surface of the semiconductor wafer 5 after completion of the required step, the wafer 5 is securely protected and is not damaged. Furthermore, as illustrated in FIG. 4, an outer peripheral portion of the adhesive sheet 6 is cut in a manner such that a cutter is moved along an outer peripheral end surface of the protective sheet. Accordingly, a cutting blade 7 is not contacted with the wafer's end surface. Thus, damage to the wafer can be reduced during application and cutting of the adhesive sheet.

Hereinbelow, preferred embodiments of the present invention will be described in detail. However, it should be construed that the invention is in no way limited to the embodiments.

The first protection structure A (FIG. 1) according to the invention will be described in detail.

The first protection structure A includes the semiconductor wafer 5 and the protective sheet 11 overlaid on the circuit surface of the semiconductor wafer, and the protective sheet is larger in outer diameter than the semiconductor wafer.

The difference in outer diameter between the protective sheet 11 and the semiconductor wafer 5 ((outer diameter of the protective sheet 11)−(outer diameter of the semiconductor wafer 5)) is preferably in the range of 0.1 to 10 mm, more preferably 0.1 to 5 mm, and particularly preferably 0.1 to 2 mm.

The semiconductor wafer 5 is supported on the protective sheet 11. When the substrate 2 has self-adhesive properties, the semiconductor wafer 5 may be supported on the substrate 2 without forming any PSA. It is also possible that the semiconductor wafer 5 is supported via the PSA layer 3.

The substrate 2 preferably includes a rigid film to achieve sufficient protective function.

Various thin films are employable as the rigid films. Synthetic resin films are preferred in view of water resistance, heat resistance and rigidity. The rigid films preferably have a value of Young's modulus×thickness of at least $5.0 \times 10^4$ N/m, and more preferably in the range of $1 \times 10^5$ to $1 \times 10^6$ N/m. The rigid films generally range in thickness from 10 μm to 5 mm, and preferably from 50 to 500 μm.

Specific examples of the rigid films include polyolefin films such as polypropylene films and polymethylpentene films, polyvinyl chloride films, polyethylene naphthalate films, polyimide films, polyether ether ketone films, polyethersulfone films, polystyrene films, polyethyleneterephthalate films, polybutyleneterephthalate films, polyurethane films and polyamide films. The rigid films may be single-layer films or laminated films of the aforementioned films.

Of the above rigid films, preferred are those that do not cause adverse effects such as ionic contamination on the wafer. Specifically, polyethyleneterephthalate films, polypropylene films, polyethylenenaphthalate films and polyamide films are particularly preferred.

On the upper surface of the substrate 2, the PSA layer 3 is provided. To attain higher adhesion with the PSA layer 3, the upper surface of the substrate 2 may be corona treated or may be overlaid with a layer such as a prime coat.

The area of the PSA layer 3 may be equal to that of the substrate 2, or may be substantially the same as that of the wafer applied to PSA layer.

The PSA layer 3 on the substrate 2 has a purpose of fixing the semiconductor wafer 5 during transportation and processing. The PSA layer 3 may be formed from an energy radiation-curable PSA, or a general-purpose, removable PSA containing rubber-based, acryl-based, silicone-based, polyurethane-based or polyvinyl ether-based.

The energy radiation-curable pressure-sensitive adhesives generally contain an acrylic PSA and an energy radiation-curable compound as main components.

For example, low-molecular weight compounds having in the molecule at least two photopolymerizable carbon-carbon double bonds that can be converted into a three-dimensional network structure by light irradiation as disclosed in JP-A-S60-196956 and JP-A-S60-223139 are widely used as the energy radiation-curable compounds incorporated in the energy radiation-curable pressure-sensitive adhesives. Specific examples thereof include trimethylolpropane triacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, and oligomers such as oligoester acrylates and urethane acrylates.

With respect to the compounding ratio of the energy radiation polymerizable compound to the acrylic PSA in the energy radiation-curable PSA, it is preferred that the energy radiation polymerizable compound is used in an amount of 50 to 200 parts by weight per 100 parts by weight of the acrylic PSA. When this condition is satisfied, the resultant PSA sheet has high initial adhesion and drastically reduces the adhesion after irradiated with energy radiation. Accordingly, easy peeling can be performed at the interface between the wafer 5 and the energy radiation-curable PSA layer.

The energy radiation-curable PSA layer may be formed from an energy radiation-curable copolymer having an energy radiation polymerizable group at a side chain. Such energy radiation-curable copolymers exhibit both tackiness and energy radiation curing properties. Details of the energy radiation-curable copolymers having an energy radiation polymerizable group at a side chain are described in, for example, JP-A-H05-32946 and JP-A-H08-27239.

The thickness of the PSA layer 3 may vary depending on the material, and is generally in the range of about 3 to 100 μm, and preferably about 10 to 50 μm.

The protective sheet 11 may be formed by applying the above PSA on the substrate 2 in an appropriate thickness with use of a known applicator such as a roll coater, a knife coater, a roll knife coater, a reverse coater or a die coater, followed by drying to produce the PSA layer 3. Alternatively, the PSA layer 3 may be formed on a release film and transferred onto the substrate 2.

Next, the second protection structure according to the present invention will be explained. The second protection structure corresponds to the first protection structure in which the substrate 2 has plural structural layers. Hereinbelow, two of the structural layers of the substrate 2 will be referred to as the "first protective layer 1" and the "second protective layer 2".

The first protective layer 1 and the second protective layer 2 may be composed of the same or different kinds of rigid films. A combination of a rigid film and another type of film is also possible. It is particularly preferred that the first protective layer 1 which faces the wafer side is formed of a stress relaxation film described later, and the second protective layer 2 which is positioned at the opposite side to the wafer is formed of a rigid film.

An example of the second protection structure is a protection structure B as shown in FIG. 2, which includes the semiconductor wafer 5 and the laminated protective sheet 12 overlaid on the circuit surface of the semiconductor wafer. The laminated protective sheet 12 comprises the first protective layer 1 having a larger diameter than the outer diameter of the semiconductor wafer and the second protective layer 2 laminated on the first protective layer 1 and having an outer diameter that is equal to the outer diameter of the first protective layer 1. The laminated protective sheet is overlaid on the circuit surface via the side of the first protective layer 1.

Another example of the second protection structure is a protection structure C as shown in FIG. 3, which includes the semiconductor wafer 5 and the laminated protective sheet 13 overlaid on the circuit surface of the semiconductor wafer. The laminated protective sheet 13 comprises the first protective layer 1 having substantially the same size as the outer diameter of the semiconductor wafer and the second protective layer 2 laminated on the first protective layer 1 and having an outer diameter that is larger than the outer diameter of the first protective layer 1. The laminated protective sheet is overlaid on the circuit surface via the side of the first protective layer 1.

The upper surface of the second protective layer 2 is provided with the adhesive layer 4 for lamination with the first protective layer 1. The first protective layer 1 and the second protective layer 2 may be bonded firmly to avoid separation, or may be separably laminated.

The adhesives for firmly bonding the first and the second protective layers 1 and 2 include rubber-based and acryl-based permanent-bonding pressure-sensitive adhesives and polyester-based and polyamide-based dry laminating adhesives. The adhesives for separably laminating the first and the second protective layers 1 and 2 include the above-mentioned pressure-sensitive adhesives for the PSA layer 3. The thickness of the adhesive layer 4 may vary depending on the material, and is generally in the range of about 1 to 100 μm, and preferably about 3 to 50 μm.

Preferably, the adhesive layer 4 is of the same size (flush) as the second protective layer 2. In the case of the protection structure C, the adhesive layer 4 may be of the same size as the first protective layer 1.

In the protection structure B, the first protective layer 1 and the second protective layer 2 are of substantially the same size. The difference in outer diameter between the laminated protective sheet 12 and the semiconductor wafer 5 ((outer diameter of the laminated protective sheet 12)–(outer diameter of the semiconductor wafer 5)) is preferably in the range of 0.1 to 10 mm, more preferably 0.1 to 5 mm, and particularly preferably 0.1 to 2 mm.

In the protection structure C, the first protective layer 1 has an area such that it can cover the circuit surface of the semiconductor wafer. The edge of the semiconductor wafer has been ground slantingly for preventing breakage and the circuit surface is formed inside the trimmed contour. Therefore, it is preferred that the outer diameter of the first protective layer 1 is equal to or slightly smaller than the outer diameter of the semiconductor wafer 5. Specifically, the difference in outer diameter between the first protective layer 1 and the semiconductor wafer 5 ((outer diameter of the first protective layer 1)–(outer diameter of the semiconductor wafer 5)) is preferably in the range of –2 to 0 mm, particularly preferably –1.5 to 0 mm, and optimally –1.0 to 0 mm.

On the other hand, the outer diameter of the second protective layer 2 is slightly larger than the outer diameter of the semiconductor wafer 5. Specifically, the difference in outer diameter between the second protective layer 2 and the semiconductor wafer 5 ((outer diameter of the second protective layer 2)–(outer diameter of the semiconductor wafer 5)) is preferably in the range of +0.1 to +10 mm, more preferably +0.1 to +5 mm, still preferably +0.1 to +2 mm, particularly preferably +0.1 to +1.5 mm, and optimally +0.1 to +1 mm.

Accordingly, the difference in outer diameter between the second protective layer 2 and the first protective layer 1 ((outer diameter of the second protective layer 2)–(outer diameter of the first protective layer 1)) is preferably in the range of +0.1 to +12 mm, more preferably +0.1 to +6 mm, still preferably +0.1 to +4 mm, particularly preferably +0.1 to +3 mm, and optimally +0.1 to +2 mm.

It is particularly preferred that the first protective layer 1 includes a stress relaxation film described later, and the second protective layer 2 includes the aforementioned rigid film.

The semiconductor wafer 5 is supported on the first protective layer 1. When the first protective layer 1 has self-adhesive properties, the semiconductor wafer 5 may be supported on the first protective layer 1 without forming any PSA. It is also possible that the semiconductor wafer 5 is supported via the abovementioned PSA 3.

The first protective layer 1 preferably includes a stress relaxation film.

The stress relaxation film has excellent stress relaxation properties. Specifically, a tensile test of the film shows a stress relaxation rate after 1 minute of 10% elongation of 40% or above, preferably 50% or above, and more preferably 60% or above. The higher the stress relaxation rate, the more preferable. The upper limit of the stress relaxation rate is theoretically 100%, and may be 99.9%, 99% or 95% depending on conditions.

The stress relaxation film has excellent stress relaxation properties such that the residual stress is attenuated immediately after the film is applied to the wafer 5. Accordingly, even when the wafer to which the laminated protective sheet 12 or 13 has been applied is ground to an ultrathin thickness and consequently becomes brittle, the wafer can be supported without curvature because of very small residual stress in the laminated protective sheet as a whole.

The thickness of the stress relaxation film is preferably in the range of 30 to 1000 μm, more preferably 50 to 800 μm, and particularly preferably 80 to 500 μm.

The stress relaxation film is not particularly limited as long as it is a resin film satisfying the above properties. Resins capable of satisfying the above properties, and resins containing appropriate additives so as to achieve the properties are employable. The stress relaxation film may be a cured film of a hardening resin or a film of a thermoplastic resin.

The hardening resins include photocurable resins and thermosetting resins. The photocurable resins are preferably employed.

As the photocurable resins, resin compositions based on photopolymerizable urethane acrylate oligomers are preferably used. The urethane acrylate oligomers suited for use in the present invention preferably range in molecular weight from 1000 to 50000, and more preferably from 2000 to 30000. The urethane acrylate oligomers may be used singly or in combination of two or more kinds.

The use of the urethane acrylate oligomer alone often results in difficult film production. Therefore, the oligomer is generally diluted with a photopolymerizable monomer, and the mixture is formed into a coating film and cured to give a film. The photopolymerizable monomer has a photopolymerizable double bond in the molecule. In the invention, acryl ester compounds having a relatively bulky group, such as isobornyl (meth)acrylate, dicyclopentenyl (meth)acrylate and phenylhydroxypropyl acrylate are particularly preferred.

The photopolymerizable monomer is preferably used in an amount of 5 to 900 parts by weight, more preferably 10 to 500 parts by weight, and particularly preferably 30 to 200 parts by weight per 100 parts by weight of the urethane acrylate oligomer.

When the stress relaxation film is formed from the photocurable resin, the resin may be mixed with a photopolymerization initiator for reduction of polymerization curing time by irradiation and dose.

The amount of the photopolymerization initiator is preferably in the range of 0.05 to 15 parts by weight, more preferably 0.1 to 10 parts by weight, and particularly preferably 0.5 to 5 parts by weight per 100 parts by weight of all the resins combined.

An appropriate combination may be selected from various combinations of the oligomers and the monomers so as to produce the hardening resins capable of satisfying the aforesaid properties.

The resins may contain additives, including inorganic fillers such as calcium carbonate, silica and mica, metal fillers such as iron and lead, and colorants such as pigments and dyes.

To produce the stress relaxation film, the liquid resin (uncured resin, solution of the resin, etc.) may be cast in a small thickness over a casting film and be produced into a film (by curing or drying) through predetermined means, followed by removal of the casting film. This process will not cause the resin to undergo high stress during film formation and rarely results in fish eyes. Furthermore, the process permits high uniformity of film thickness, with the thickness accuracy being generally within 2%.

Other processes for producing the stress relaxation films include extrusion with use of a T-die or an inflation, and calendering.

To achieve higher adhesion with the PSA layer 3, the upper surface of the first protective layer 1 may be corona treated or may be overlaid with a layer such as a primer coat. The PSA layer 3 is as described with respect to the first protection structure A.

The semiconductor wafer protection structures according to the present invention are suitably adopted to storage, transportation and processing of ultrathin semiconductor wafers. Particularly, the protection structures are useful for the protection of the circuit surface during backgrinding the wafer to an ultrathin thickness, and for storage and transportation of the ultrathin wafers.

When a semiconductor wafer is subjected to a backgrinding step using the protection structure A, the protective sheet 11 is applied to the circuit surface of the semiconductor wafer 5 and backgrinding is performed by a conventional method.

When a semiconductor wafer is subjected to a backgrinding step using the protection structure B or C, the laminated protective sheet 12 or 13 is applied to the surface of the wafer 5 via the PSA layer 3. The surface of the wafer 5 is provided with a circuit pattern. The application is performed by use of a laminator specialized for wafer manufacturing while adding as small tension as possible. However, since application is practically impossible without any tension at all, the tension often accumulates in usual PSA sheets as residual stress. In the invention, the use of the stress relaxation film as the first protective layer 1 provides stress relaxation so that the internal stress can be reduced. The rigid films are less susceptible to tension from application and suffer little residual internal stress.

When the laminated protective sheet is employed, the first protective layer 1 may be applied to the circuit surface of the wafer 5 and the second protective layer 2 may be applied to the exposed surface of the first protective layer 1. It is also possible that the first protective layer 1 and the second protective layer 2 are previously laminated and the resultant laminated protective sheet is overlaid on the circuit surface of the wafer 5 via the side of the first protective layer 1.

In the latter case, the first protective layer 1 and the second protective layer 2 may be supplied as a laminated sheet precut into predetermined size, or may be supplied as uncut laminated sheet and be cut into predetermined size after applied to the wafer 5. In the preferred embodiment of the protection structure C, the first protective layer 1 is supplied as an uncut sheet, is applied to the wafer 5, and is cut with a cutter knife along the edge of the wafer 5; subsequently, the second protective layer 2 is supplied as a sheet precut into predetermined size and is laminated on the first protective layer 1 so as to align the centers of the wafer 5 and the second protective layer 2. Thus, the protection structure C for semiconductor wafer according to the present invention can be fabricated with high precision.

While the semiconductor wafer is protected with the protection structure as described above, the back surface of the wafer is ground with a grinder or the like until a predetermined thickness is reached, optionally followed by chemical polishing by etching or the like.

The wafer may be ground to a thickness of, for example, 30 to 100 µm. As described above, the usual PSA sheets suffer residual stress as a result of accumulation of tension at the time of application, and the ultrathin wafers are often caused to warp. In the invention, the use of the stress relaxation film provides stress relaxation so that the internal stress can be reduced. Accordingly, the wafer will not be warped even if ground to an ultrathin thickness.

After completion of the grinding step as described above, the wafers 5 are stored in a wafer cassette and transported to the next step. Since the maximum diameter of the protective sheet 11 or the laminated protective sheet 12 or 13 is slightly larger than that of the wafer 5, the semiconductor wafer protection structure stored in the wafer cassette can prevent the edge of the wafers 5 from direct contact with the sidewalls of the cassette. Accordingly, the wafer can be transported without damage. Namely, the end portion of the protective sheet functions as cushion to protect the wafer 5.

After transportation and storage, the semiconductor wafer is subjected to a dicing step. Prior to the dicing step, the adhesive sheet 6 is often applied to the ground surface (back surface of the circuit surface) of the wafer for various purposes such as formation of a die-bonding adhesive layer. After the adhesive sheet 6 is applied, the protective sheet or the laminated protective sheet is removed to transfer the wafer to the adhesive sheet 6. The adhesive sheet used herein may be selected without limitation from adhesive sheets having various functions, including die-bonding sheets and semiconductor processing adhesive sheets.

When the adhesive sheet 6 has no functions as a dicing tape (no functions for fixing the wafer or picking up the chips), the adhesive sheet 6 having substantially the same size as the wafer is applied to the wafer; thereafter a dicing tape is applied to the exposed surface of the adhesive sheet and the laminate is subjected to the dicing step. The adhesive sheet 6 having substantially the same size as the wafer may be produced by previously cutting the sheet into the size before application to the wafer. Most frequently, however, the adhesive sheet 6 in the form of uncut tape is applied to the wafer and is cut along the outer periphery of the wafer.

When the semiconductor wafer is protected with the protection structure of the present invention, the wafer 5 is securely protected and is not damaged even during application of the adhesive sheet 6 to the ground surface of the semiconductor wafer 5. Furthermore, as illustrated in FIG. 4, an outer peripheral portion of the adhesive sheet 6 is cut in a manner such that a cutter is moved along the outer peripheral end surface of the protective sheet. That is, the cutting blade 7 is not contacted with the wafer's end surface. Accordingly, damage to the wafer can be reduced during application and cutting of the adhesive sheet.

Subsequently, the protective sheet or the laminated protective sheet is removed, and thereby the wafer is transferred to the adhesive sheet 6. Thereafter, conventional steps such as dicing are performed to produce semiconductor devices.

When the adhesive layer 4 is composed of a removable adhesive, it is preferable that the adhesive sheet 6 is applied to the wafer's ground surface and the outer peripheral portion of the adhesive sheet is cut off; thereafter, the second protective layer 2 is removed and, prior to the dicing, the first protective layer 1 is removed from the wafer surface. Separate removing steps for the second protective layer 2 and the first protective layer 1 enable reduction of flexure stress to the wafer as compared to collective release of the first and the second protective layers 1 and 2.

After the first and the second protective layers 1 and 2 are both removed and thereby the wafer is transferred to the dicing tape, the wafer is diced by a conventional method into semiconductor chips, which are manufactured into semiconductor devices by a conventional process.

The laminated protective sheet for semiconductor wafer according to the present invention is the laminated protective sheet 13 used in the protection structure C.

That is, the laminated protective sheet 13 for semiconductor wafer is a laminate of the first and the second protective layers 1 and 2 in which the second protective layer 2 is larger in outer diameter than the first protective layer 1.

Preferred embodiments of the laminated protective sheet for semiconductor wafer are the same as described for the aforementioned semiconductor wafer protection structures.

The semiconductor wafer protection structures and methods, and the laminated protective sheet for use therein enable prevention of damage to a wafer during grinding and transportation when the wafer is ground to an ultrathin thickness and transported.

According to the process for processing a semiconductor wafer as described above, a semiconductor wafer is not damaged when an adhesive sheet is applied thereto, and the wafer's end surface is prevented from contact with a cutting blade when an outer peripheral portion of the adhesive sheet is cut off. Therefore, the probability that the wafer will be damaged during application and cutting of the adhesive sheet can be reduced.

EXAMPLES

Hereinbelow, the present invention will be described in greater detail by Examples. However, it should be construed that the invention is not limited thereto.

The "wafer transportation ability" and "adhesive sheet applying ability" were evaluated by the methods described below.

(Wafer Transportation Ability)

In Examples and Comparative Examples, respective semiconductor wafer protection structures were produced. Then, the silicon wafers were ground to thickness of 50 μm by means of a wafer grinder (grinder DFG series manufactured by DISCO CORPORATION). The wafer protection structures were then stored in a wafer cassette case with use of a wafer carrier exchanger (Adwill RAD-CXV manufactured by LINTEC CORPORATION) Subsequently, the wafer cassette case was manually transported and installed into a cassette house of a dicing tape mounter (Adwill RAD-2500 series manufactured by LINTEC CORPORATION).

Ten 8-inch (200 mm) wafers were processed in each Example or Comparative Example, and evaluation was performed by counting the number of cracked wafer edges or damaged wafers.

(Adhesive Sheet Applying Ability)

In Examples and Comparative Examples, respective semiconductor wafer protection structures were produced. Then, the silicon wafers were ground to thickness of 50 μm by means of a wafer grinder (grinder DFG series manufactured by DISCO CORPORATION). An adhesive sheet (Adwill LP series manufactured by LINTEC CORPORATION) was laminated on the ground surface of the wafer while protecting another surface with the protective sheet, using laminator Adwill RAD-3500 series (manufactured by LINTEC CORPORATION). The lamination of the adhesive sheet was performed under heating at about 150° C. to increase adhesion of the adhesive sheet to the wafer's ground surface. Thereafter, the adhesive sheet was cut into a predetermined size by moving a knife along the wafer configuration.

Ten 8-inch (200 mm) wafers were processed in each Example or Comparative Example, and evaluation was performed by counting the number of wafers cracked or damaged during lamination of the adhesive sheet.

Example 1

(1) Stress Relaxation Film 50 parts by weight of a urethane acrylate oligomer having a weight-average molecular weight of 5000 (manufactured by ARAKAWA CHEMICAL INDUSTRIES, LTD.), 25 parts by weight of isobornyl acrylate, 25 parts by weight of phenylhydroxypropyl acrylate, 2.0 parts by weight of a photopolymerization initiator (IRGACURE 184 manufactured by CIBA SPECIALTY CHEMICALS) and 0.2 part by weight of phthalocyanine pigment were mixed together to give a photocurable resin composition as a material for forming a stress relaxation film.

The resin composition thus obtained was applied over a polyethyleneterephthalate (PET) film (product of Toray Industries, Inc., thickness: 38 μm), in a thickness of 110 μm by the fountain die method. Thus, a resin composition layer was formed. Immediately after the application, the same PET film was laminated on the resin composition layer, and the laminate was UV irradiated at a dose of 250 mJ/cm$^2$ with use of a high-pressure mercury lamp (160 W/cm, height: 10 cm) thereby to crosslink and cure the resin composition layer. The PET films on the both surfaces were removed. Thus, a stress relaxation film was obtained which had a thickness of 110 μm, a stress relaxation rate of 87%, and a Young's modulus of $1.8 \times 10^8$ Pa.

(2) Pressure-sensitive Adhesive for Sticking to Wafer's Circuit Surface

An energy radiation-curable copolymer having an energy radiation polymerizable group at a side chain was compounded with 5 parts by weight of a curing agent (addition product of tolyene diisocyanate and trimethylolpropane) and 5 parts by weight of a photopolymerization initiator (IRGACURE 184 manufactured by CIBA SPECIALTY CHEMICALS) to prepare a PSA. The above energy radiation-curable copolymer had been obtained by reaction of 100 parts by weight of a copolymer that consisted of 85 parts by weight of n-butyl acrylate and 15 parts by weight of 2-hydroxyethyl acrylate and had a weight-average molecular weight of about 650000, with 16 parts by weight of methacryloyloxyethyl isocyanate. The thus-obtained PSA was applied to a PET release film (SP-PET 3801 manufactured by LINTEC CORPORATION, thickness: 38 μm) with use of a roll knife coater so as to achieve a dry thickness of 15 μm, followed by drying. The resultant adhesive layer was transferred to the stress relaxation film prepared in (1). Thus, a first protective layer 1 was prepared.

(3) Second Protective Layer

An acrylic permanent-bonding type PSA (PK manufactured by LINTEC CORPORATION) was applied to a PET release film (SP-PET 3801 manufactured by LINTEC CORPORATION, thickness: 38 μm) so as to achieve a dry thickness of 20 μm, followed by drying. The resultant adhesive layer was transferred to a rigid PET film (product of Toray Industries, Inc., thickness: 125 μm, Young's modulus: $4.9 \times 10^9$ Pa, value of thickness×Young's modulus: $6.1 \times 10^5$ N/m). Thus, a second protective layer was prepared.

(4) Configuration of Laminated Protective Sheet

The second protective layer was precut into a circular form 201 mm in diameter. The release film on the first protective layer was peeled, and the first protective layer was laminated to the mirror surface of a silicon wafer (200 mm in diameter, 750 µm in thickness) via the exposed PSA with use of a tape laminator (Adwill RAD 3500/m12 manufactured by LINTEC CORPORATION). The first protective layer was cut along the contour of the silicon wafer. The cutting was performed while tilting a cutter at an angle of about 15° relative to the vertical surface of the first protective layer. As a result, the diameter of the surface of first protective layer became 199.9 mm.

Thereafter, the exposed surface of the first protective layer was laminated with the second protective layer via the PSA layer with center alignment. Thus, a semiconductor wafer protection structure was fabricated.

Example 2

The first and the second protective layers produced in Example 1 (1) to (3) were cut into circular forms 199.5 mm and 201 mm in diameter respectively. The release film on the second protective layer was peeled, and the second protective layer was laminated to the stress relaxation film of the first protective layer, via the exposed PSA with center alignment. Thus, a laminated protective sheet was produced. Subsequently, the laminated protective sheet was laminated to the mirror surface of a silicon wafer via the PSA layer of the first protective layer with center alignment. Thus, a semiconductor wafer protection structure was fabricated.

Examples 3-5

The first and the second protective layers produced in Example 1 (1) to (3) were laminated in a manner such that the release film on the second protective layer was peeled and the second protective layer was laminated to the stress relaxation film of the first protective layer, via the exposed PSA. The resultant laminated protective sheet was precut into a circular form 201 mm in diameter. Subsequently, the laminated protective sheet was laminated to the mirror surface of a silicon wafer via the PSA layer of the first protective layer with center alignment. Thus, a semiconductor wafer protection structure was fabricated (Example 3). Semiconductor wafer protection structures 205 mm and 208 mm in diameter of the laminated protective sheet were produced in a similar manner in Examples 4 and 5 respectively.

Examples 6-7

The first and the second protective layers produced in Example 1 (1) to (3) were laminated in a manner such that the release film on the second protective layer was peeled and the second protective layer was laminated to the stress relaxation film of the first protective layer, via the exposed PSA. The resultant laminated protective sheet was laminated to the mirror surface of a silicon wafer via the PSA layer of the first protective layer with center alignment. Thereafter, the laminated protective sheet was cut such that the outer diameter across the center of the wafer became 201 mm. Thus, a semiconductor wafer protection structure was fabricated (Example 6). In Example 7, a semiconductor wafer protection structure having a laminated protective sheet diameter of 208 mm was produced in a similar manner.

Example 8

The PSA employed in Example 1(2) was applied to a PET release film (SP-PET 3801 manufactured by LINTEC CORPORATION, thickness: 38 µm) so as to achieve a dry thickness of 20 µm, followed by drying. The resultant adhesive layer was transferred to a rigid PET film (product of Toray Industries, Inc., thickness: 125 µm, Young's modulus: $4.9 \times 10^9$ Pa, value of thickness×Young's modulus: $6.1 \times 10^5$ N/m). Thus, a protective sheet was prepared. Thereafter, the protective sheet was precut into a circular form 205 mm in diameter. Subsequently, the protective sheet was laminated to the mirror surface of a silicon wafer with center alignment. Thus, a semiconductor wafer protection structure was fabricated.

Example 9

The PSA employed in Example 1(2) was applied to a PET release film (SP-PET 3801 manufactured by LINTEC CORPORATION, thickness: 38 µm) so as to achieve a dry thickness of 20 µm, followed by drying. The resultant adhesive layer was transferred to a rigid PET film (product of Toray Industries, Inc., thickness: 125 µm, Young's modulus: $4.9 \times 10^9$ Pa, value of thickness×Young's modulus: $6.1 \times 10^5$ N/m). Thus, a protective sheet was prepared. Thereafter, the protective sheet was laminated to the mirror surface of a silicon wafer with center alignment. Subsequently, the protective sheet was cut such that the outer diameter across the center of the wafer became 205 mm. Thus, a semiconductor wafer protection structure was fabricated.

Comparative Example 1

The release film on the second protective layer produced in Example 1 (3) was peeled, and the second protective layer was laminated to the stress relaxation film of the first protective layer produced in Example 1 (1) to (2), via the exposed PSA layer. Thus, a laminated protective sheet was prepared. Subsequently, the laminated protective sheet was laminated to the mirror surface of a silicon wafer with use of a tape laminator, and was cut along the contour of the silicon wafer. Thus, a semiconductor wafer protection structure was fabricated. The diameter of the uppermost substrate surface of the protective sheet was 199.8 mm.

Comparative Example 2

The first protective layer produced in Example 1 (1) to (2) was laminated to the mirror surface of a silicon wafer via the PSA layer with center alignment. Thereafter, the protective layer was cut along the contour of the silicon wafer. Thus, a semiconductor wafer protection structure was fabricated. The diameter of the uppermost substrate surface of the protective sheet was 199.8 mm.

The constitution of Examples and Comparative Examples is shown in Table 1, and the evaluation results in Table 2.

TABLE 1

| | First protective layer | | | Second protective layer | | | Adhesive layer[1] Type/ Thkns. | Application method[2] | Cutting method[3] |
|---|---|---|---|---|---|---|---|---|---|
| | Thkns. (μm) | Stress relaxation rate (%) | UV PSA thickness (μm) | Thkns. (μm) | Young's modulus (Pa) | Thkns. X Young's modulus N/m | | | |
| Ex. 1 | 110 | 87 | UV type 15 μm | PET 125 | $4.9 \times 10^9$ | $6.1 \times 10^5$ | PK 20 μm | Two-time lamination | only 2nd protective layer precut: 201 mm |
| Ex. 2 | 110 | 87 | UV type 15 μm | PET 125 | $4.9 \times 10^9$ | $6.1 \times 10^5$ | PK 20 μm | One-time lamination | 1st: 199.5 mm 2nd: 201 mm |
| Ex. 3 | 110 | 87 | UV type 15 μm | PET 125 | $4.9 \times 10^9$ | $6.1 \times 10^5$ | PK 20 μm | One-time lamination | Precut: 201 mm |
| Ex. 4 | 110 | 87 | UV type 15 μm | PET 125 | $4.9 \times 10^9$ | $6.1 \times 10^5$ | PK 20 μm | One-time lamination | Precut: 205 mm |
| Ex. 5 | 110 | 87 | UV type 15 μm | PET 125 | $4.9 \times 10^9$ | $6.1 \times 10^5$ | PK 20 μm | One-time lamination | Precut: 208 mm |
| Ex. 6 | 110 | 87 | UV type 15 μm | PET 125 | $4.9 \times 10^9$ | $6.1 \times 10^5$ | PK 20 μm | One-time lamination | After cut: 201 mm |
| Ex. 7 | 110 | 87 | UV type 15 μm | PET 125 | $4.9 \times 10^9$ | $6.1 \times 10^5$ | PK 20 μm | One-time lamination | After cut: 208 mm |
| Ex. 8 | — | — | — | PET 125 | $4.9 \times 10^9$ | $6.1 \times 10^5$ | UV type 20 μm | One-time lamination | Precut: 205 mm |
| Ex. 9 | — | — | — | PET 125 | $4.9 \times 10^9$ | $6.1 \times 10^5$ | UV type 20 μm | One-time lamination | After cut: 205 mm |
| Comp. Ex. 1 | 110 | 87 | UV type 15 μm | PET 125 | $4.9 \times 10^9$ | $6.1 \times 10^5$ | PK 20 μm | One-time lamination | After cut: 199.8 mm |
| Comp. Ex. 2 | 160 | 87 | UV type 20 μm | — | — | — | — | One-time lamination | After cut: 199.8 mm |

Thkns.: Thickness
[1]PK (permanent-bonding type PSA), UV type (UV curable PSA)
[2]Two-time lamination (The first protective layer was laminated on the wafer, and then the second protective layer was laminated on the first protective layer.) One-time lamination (The second protective layer was laminated on the first protective layer, and then the laminate was laminated on the wafer via the side of the first protective layer. In Examples 8 and 9 and Comparative Example 2, a single-layer film was laminated.)
[3]Precut (Cut into a predetermined size before lamination) After cut (cut into a predetermined size after lamination) 1st = First protective layer, 2nd = Second protective layer

TABLE 2

| | Result of grinding to 50 μm | Wafer transportation properties | Adhesive sheet applying properties | Remarks |
|---|---|---|---|---|
| Ex. 1 | 10/10 successful | 10/10 no damaged wafer | 10/10 no damaged wafer | |
| Ex. 2 | 10/10 successful | 10/10 no damaged wafer | 10/10 no damaged wafer | |
| Ex. 3 | 10/10 successful | 10/10 no damaged wafer | 10/10 no damaged wafer | |
| Ex. 4 | 10/10 successful | 10/10 no damaged wafer | 10/10 no damaged wafer | |
| Ex. 5 | 10/10 successful | 10/10 no damaged wafer | 10/10 no damaged wafer | |
| Ex. 6 | 10/10 successful | 10/10 no damaged wafer | 10/10 no damaged wafer | |
| Ex. 7 | 10/10 successful | 10/10 no damaged wafer | 10/10 no damaged wafer | |
| Ex. 8 | 10/10 successful | 10/10 no damaged wafer | 10/10 no damaged wafer | |
| Ex. 9 | 10/10 successful | 10/10 no damaged wafer | 10/10 no damaged wafer | |
| Comp. Ex. 1 | 10/10 successful | 7/10 three damaged wafers | 5 of 10 wafers damaged | Wafer damaged during adhesive sheet cutting |
| Comp. Ex. 2 | 10/10 successful | 6/10 four damaged wafers | 7 of 10 wafers damaged | |

The invention claimed is:

1. A semiconductor wafer protection structure, comprising a circular semiconductor wafer and a circular laminated protective sheet overlaid on a circuit surface of the circular semiconductor wafer, whereby said circular laminated protective sheet prevents vibration and damage to the wafer during backgrinding and transportation,
wherein the circular laminated protective sheet comprises a first circular protective layer having substantially the same size as an outer diameter of the circular semiconductor wafer and a second circular protective layer laminated on the first circular protective layer and having an outer diameter that is equal to or larger than the outer diameter of the first circular protective layer, and the circular laminated protective sheet is overlaid on the circuit surface via the side of the first circular protective layer, and
the first circular protective layer includes a film having a stress relaxation rate of at least 40% after 1 minute of 10% elongation, and the second circular protective layer includes a film having a value of Young's modulus×thickness of at least $5.0 \times 10^4$ N/m.

2. The semiconductor wafer protection structure according to claim 1, wherein the first circular protective layer has an outer diameter that is smaller than the outer diameter of the circular semiconductor wafer by −2.0 to 0 mm and the second circular protective layer has an outer diameter that is larger than the outer diameter of the circular semiconductor wafer by +0.1 to +2.0 mm.

3. The semiconductor wafer protection structure according to claim 1, wherein the circular laminated protective sheet has a maximum diameter that is larger than the outer diameter of the circular semiconductor wafer by +0.1 to 10 mm.

4. A laminated protective sheet for a circular semiconductor wafer comprising a first circular protective layer and a second circular protective layer, whereby said circular laminated protective sheet prevents vibration and damage to the wafer during backgrinding and transportation, wherein the second circular protective layer has a larger outer diameter than that of the first circular protective layer, and the first circular protective layer includes a film having a stress relaxation rate of at least 40% after 1 minute of 10% elongation, and the second circular protective layer includes a film having a value of Young's modulus×thickness of at least $5.0 \times 10^4$ N/m.

5. The laminated protective sheet for a circular semiconductor wafer according to claim 4, wherein the second circular protective layer has an outer diameter that is larger than the outer diameter of the first circular protective layer by +0.1 to +4.0 mm.

* * * * *

UNITED STATES PATENT AND TRADEMARK OFFICE
CERTIFICATE OF CORRECTION

PATENT NO. : 7,361,971 B2  Page 1 of 1
APPLICATION NO. : 10/525996
DATED : April 22, 2008
INVENTOR(S) : Senoo et al.

It is certified that error appears in the above-identified patent and that said Letters Patent is hereby corrected as shown below:

On the title page, see Item (56) References Cited, U.S. PATENT DOCUMENTS, insert the following two U.S. references:
- 5,637,395  B1  6/1997  Uemura et al.
  6,910,403  B1  6/2005  Ishikawa et al. --

On the title page, see Item (56) References Cited, FOREIGN PATENT DOCUMENTS, insert the following six Japanese references:
- JP  60-223139 A  11/1985
  JP  5-032946  A  2/1993
  JP  8-027239  A  1/1996
  JP  2005-057208 A2/2002
  JP  2003-129011 A5/2003
  JP  2003-261842 A9/2003 --

Column 12, line 41, "tolyene" should read -- tolylene --

Signed and Sealed this

Thirtieth Day of June, 2009

JOHN DOLL
*Acting Director of the United States Patent and Trademark Office*